United States Patent
Chang

(10) Patent No.: US 7,809,056 B2
(45) Date of Patent: Oct. 5, 2010

(54) SPREAD SPECTRUM DEVICE AND RELATED RANDOM CLOCK GENERATOR FOR A SWITCHING AMPLIFIER

(75) Inventor: Ming-Hung Chang, Hsin-Chu Hsien (TW)

(73) Assignee: Anpec Electronics Corporation, Hsin-Chu (TW)

( * ) Notice: Subject to any disclaimer, the term of this patent is extended or adjusted under 35 U.S.C. 154(b) by 580 days.

(21) Appl. No.: 11/942,729

(22) Filed: Nov. 20, 2007

(65) Prior Publication Data

US 2008/0303572 A1 Dec. 11, 2008

Related U.S. Application Data

(60) Provisional application No. 60/942,211, filed on Jun. 6, 2007.

(51) Int. Cl.
*H03K 7/08* (2006.01)

(52) U.S. Cl. .................. 375/238; 375/130; 330/251; 327/36; 327/73

(58) Field of Classification Search ............... 375/238; 330/251; 327/36, 73
See application file for complete search history.

(56) References Cited

U.S. PATENT DOCUMENTS

| | | | |
|---|---|---|---|
| 6,107,776 A * | 8/2000 | Nakazawa | 318/811 |
| 6,466,087 B2 * | 10/2002 | Ruha | 330/10 |
| 2004/0232978 A1 * | 11/2004 | Easson et al. | 330/10 |
| 2007/0252568 A1 * | 11/2007 | Chien | 323/284 |

* cited by examiner

*Primary Examiner*—Sudhanshu C Pathak
(74) *Attorney, Agent, or Firm*—Winston Hsu; Scott Margo; Min-Lee Teng

(57) ABSTRACT

A random clock generator for a spread spectrum modulating device includes a random number generator for generating a plurality of random number signals according to a first square wave signal and a control signal, a reference wave generator coupled to the random number generator for generating a triangular signal and a second square wave signal according to the plurality of random number signals, and a trigger signal generator coupled to the random number generator and the reference wave generator, for generating the first square wave signal according to the second square wave signal.

20 Claims, 11 Drawing Sheets

US 7,809,056 B2

SPREAD SPECTRUM DEVICE AND RELATED RANDOM CLOCK GENERATOR FOR A SWITCHING AMPLIFIER

CROSS REFERENCE TO RELATED APPLICATIONS

This application claims the benefit of U.S. Provisional Application No. 60/942,211, filed on Jun. 6, 2007 and entitled "Spread spectrum modulation for switching amplifier and switching regulator", the contents of which are incorporated herein by reference.

BACKGROUND OF THE INVENTION

1. Field of the Invention

The present invention is related to a spread spectrum device and related random clock generator for a switching amplifier, and more particularly, to a spread spectrum device and related random clock generator capable of lowering electromagnetic interference of output signals of the switching amplifier.

2. Description of the Prior Art

Because a switching amplifier has a high operational efficiency approaching ninety percent, the switching amplifier becomes a primary choice of mobile devices with low power cost. Compared to traditional AB type of amplifiers at the same output wattage, the switching amplifiers have lower power cost and temperature because of higher operational efficiency. Despite the cost and space of radiators, the switching amplifiers in thin products are more and more popular. But output signals of the switching amplifiers are high frequency pulse signals so as to transpire electromagnetic interference through longer transmission lines easily. General solutions include adding a group of low-pass filters in the output end to filter out high frequency parts and outputting audio signals through transmission lines. But advantages of switching amplifiers are dramatically discounted because of the increased cost and space of low pass filters. Therefore, many techniques of decreasing electromagnetic interference are generated.

The popular prior art utilizes spread spectrum to randomly vary the operational frequency in a specific range for avoiding surpassing the requirements of electromagnetic compatibility because of switching frequency and centralization of harmonics energy. But linearity of the triangular wave generated in the prior art is not good and easily causes serious distortion problems.

SUMMARY OF THE INVENTION

It is therefore a primary objective of the claimed invention to provide a switching amplifier with output signal feedback correction to lower output signal distortion dramatically and use a spread spectrum device with feedback control to maintain the linearity of the triangular wave for achieving the purpose of low cost, Hi-Fi, and low electromagnetic interference.

The present invention discloses a random clock generator for a spread spectrum modulating device comprising a random number generator for periodically generating a plurality of random number signals according to a first square wave signal and a control signal; a reference wave generator coupled to the random number generator for generating a triangular signal and a second square wave signal according to the plurality of random number signals; and a trigger signal generator coupled to the random number generator and the reference wave generator, for generating the first square wave signal according to the second square wave signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
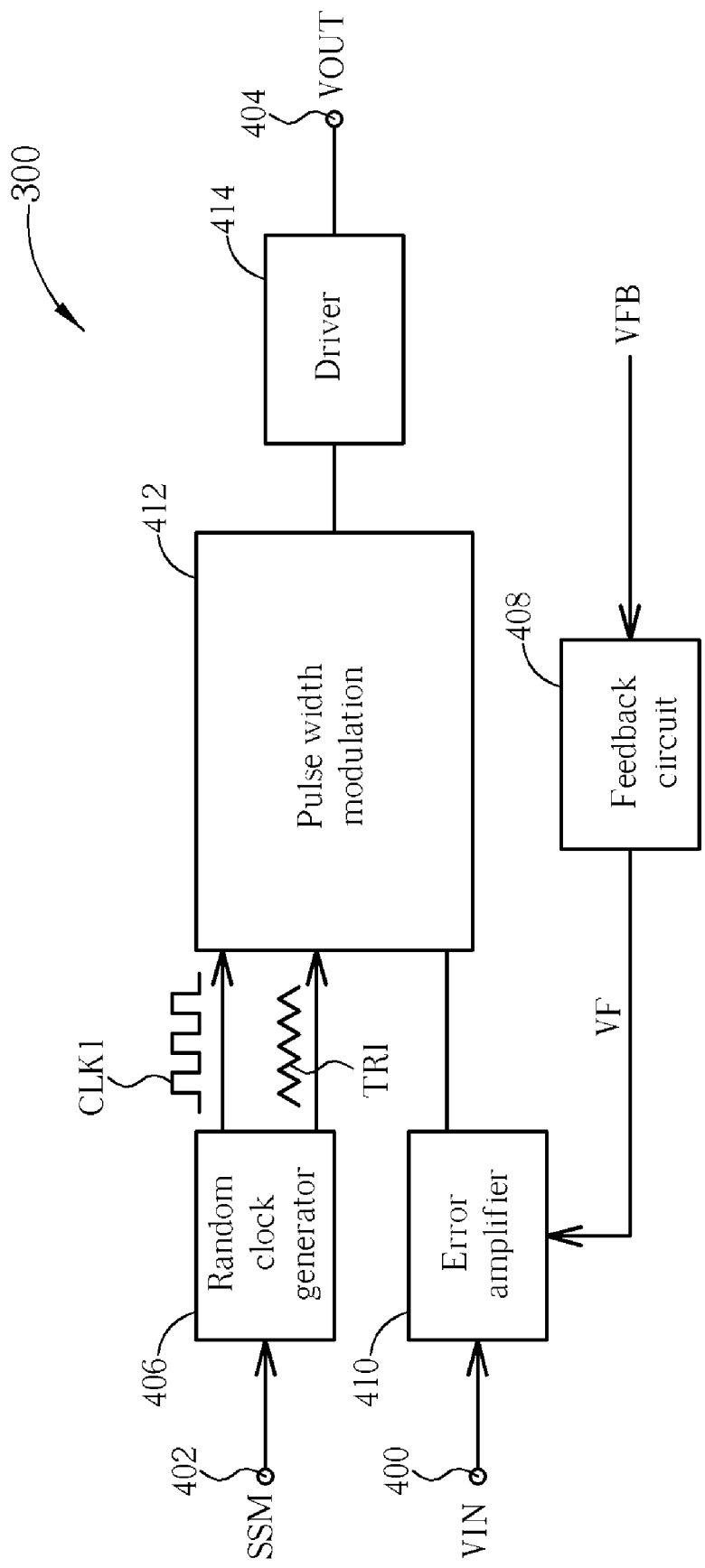
FIG. 1 illustrates a schematic diagram of a switching amplifier of a spread spectrum pulse width modulation unit according to an embodiment of the present invention.

Please refer to FIG. 1. FIG. 1 illustrates a schematic diagram of a switching amplifier 300 of a spread spectrum pulse width modulation unit according to an embodiment of the present invention. The switching amplifier 300 of a spread spectrum pulse width modulation unit comprises an input end 400, a controlling end 402, an output end 404, a random clock generator 406, a feedback circuit 408, an error amplifier 410, a pulse width modulation unit 412, and a driver 414. The input end 400 is utilized for receiving the source VIN generated by an audio generation unit (not shown in FIG. 1). Through the pulse width modulation unit 412, the output end 404 outputs a driving signal VOUT to a speaker (not shown in FIG. 1). The random clock generator 406 coupled to the controlling end 402 is utilized for generating a triangular wave signal TRI and a square wave signal CLk1 with fixed frequency or spread spectrum according to a control signal received by the controlling end 402. The feedback circuit 408 generates a feedback signal VF according to the driving signal VOUT or an external signal VFB. The error amplifier 410 coupled to the feedback circuit 408 and the input end 400 is utilized for comparing the feedback signal VF and the source VIN for generating a comparative result. The pulse width modulation unit 412 coupled to the random clock generator 406 and the error amplifier 410 modulates the comparative result generated by the error amplifier 410 for generating a modulating result according to the triangular wave signal TRI and the second square wave signal CLK1. Finally, the driver 414 coupled between the pulse width modulation unit 412 and the output end 404 is utilized for generating driving signal VOUT according to the modulating result of the pulse width modulation unit 412.

Figure 2:
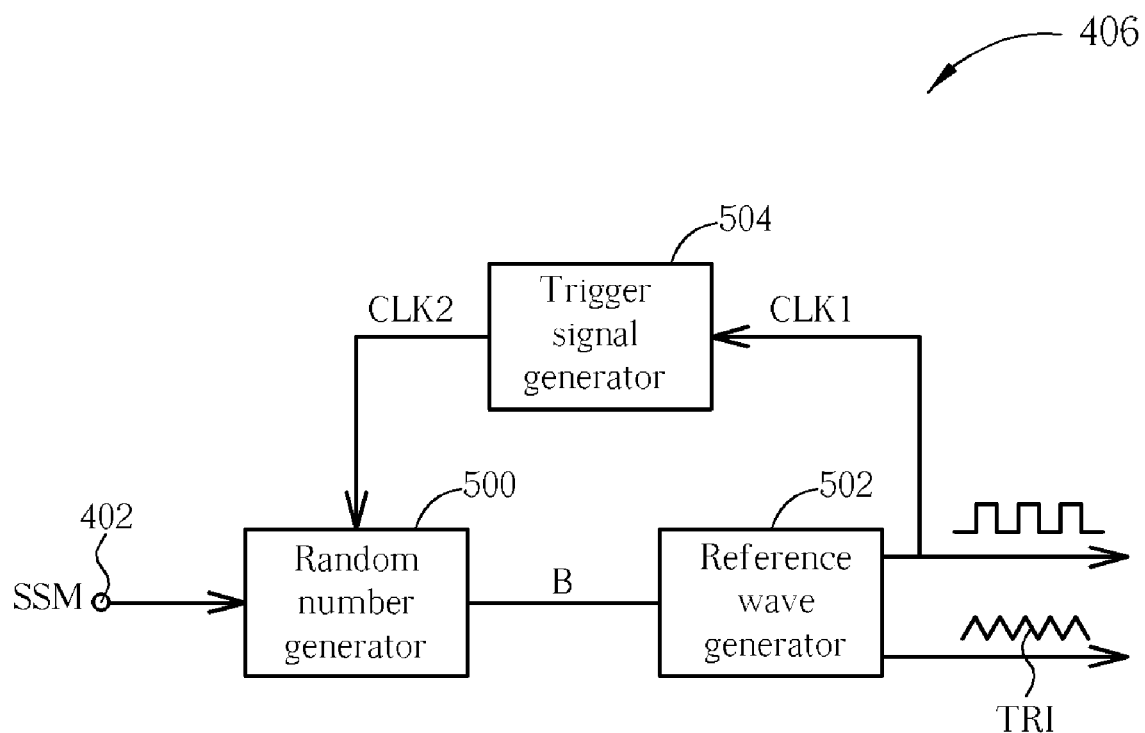
FIG. 2 illustrates a schematic diagram of a random clock generator shown in FIG. 1.

Please refer to FIG. 2. FIG. 2 illustrates a schematic diagram of the random clock generator 406 shown in FIG. 1. The random clock generator 406 comprises a random number generator 500, a reference wave generator 502, and a trigger signal generator 504. The random number generator 500 coupled to the controlling end 402 generates a random number B according to a square signal CLK2 and the control signal SSM output from the trigger signal generator 504. The random number B is composed of random signals $b_0$, $b_1, \ldots, b_{n-1}$. The reference wave generator 502 coupled to the random number generator 500, the trigger signal generator 504, and the pulse width modulation unit 412 is utilized for generating the triangular wave signal TRI and the square wave signal CLK1 to the pulse width modulation unit 412 and the trigger signal generator 504. The trigger signal generator 504 coupled to the reference wave generator 502 and the random number generator 500 is utilized as a frequency divider of the square wave signal CLK1 for generating the square wave signal CLK2 according to a predetermined divisor.

Figure 3:
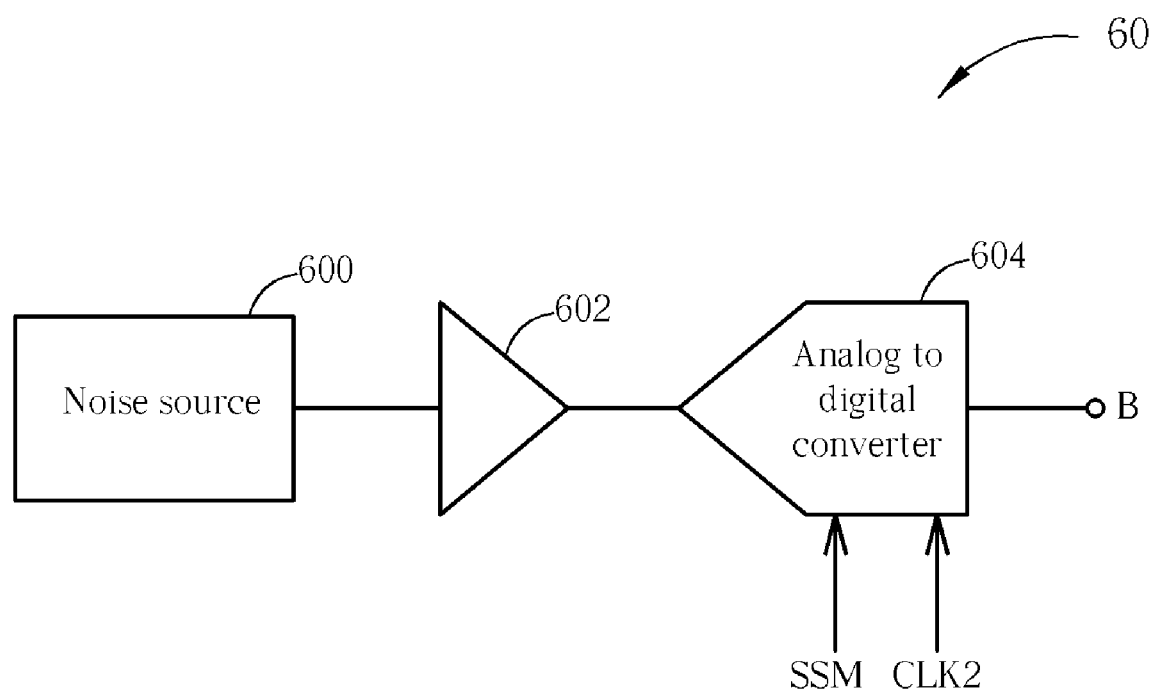
FIG. 3 illustrates a schematic diagram of a random generator.
Figure 4:
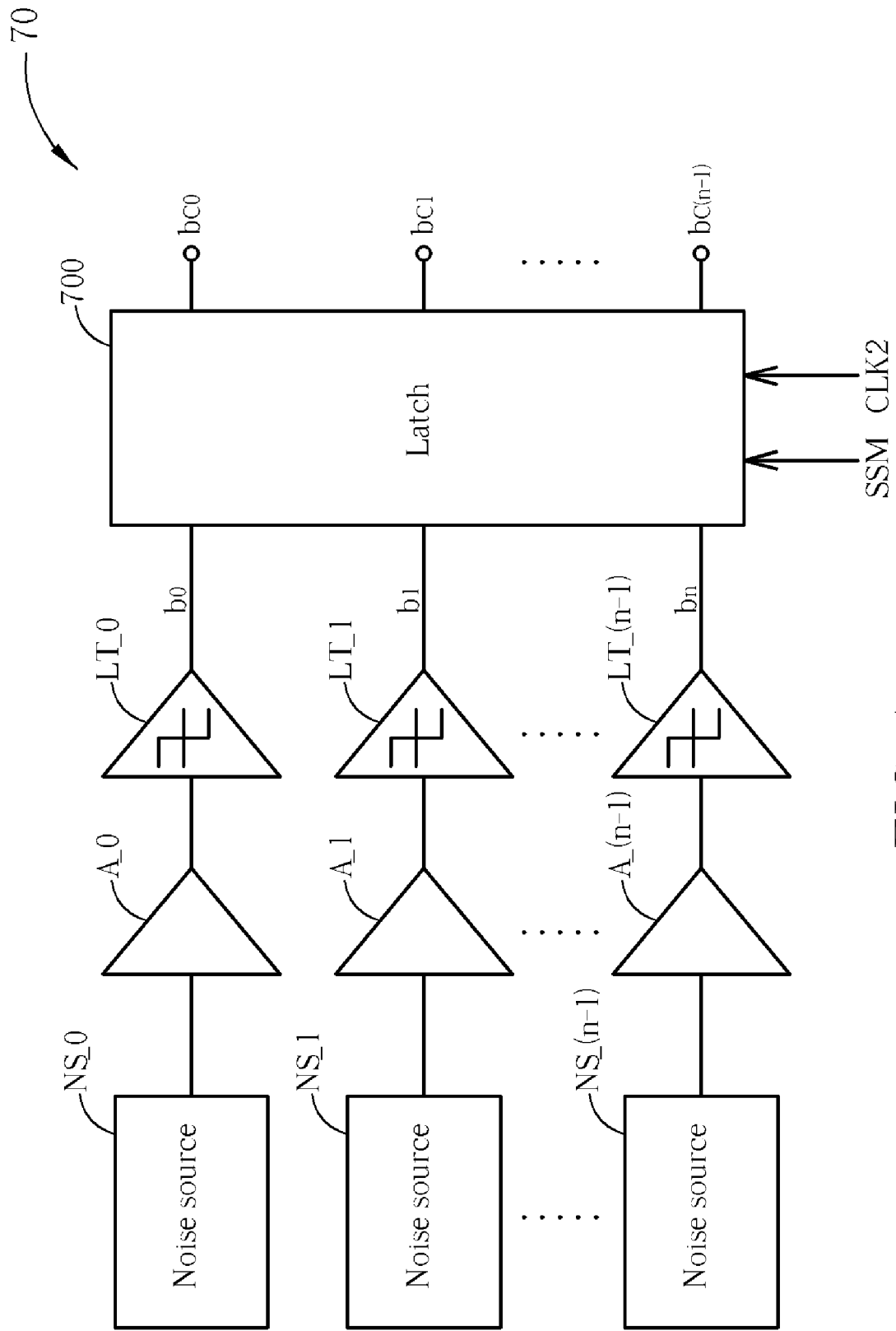
FIG. 4 illustrates a schematic diagram of a random generator.

In the present invention, the random number generator 500 generates random signals $b_0, b_1, \ldots, b_{n-1}$ according to the noise source. The realization methods can be designed according to different requirements. For example, please refer to FIG. 3 and FIG. 4. FIG. 3 and FIG. 4 respectively represent the schematic diagrams of a random number generator 60 and a random number generator 70. The random number generator 60 comprises a noise source 600, an amplifier 602, and an analog to digital converter 604. The analog to digital converter 604 controlled by the control signal SSM is utilized for generating the random signals $b_0, b_1, \ldots, b_{n-1}$ on the rising edge, descending edge or both edges. On the other hand, the random number generator 70 comprises noise sources NS_0, NS_1, ... NS_n-1, amplifiers A_0, A_1, ..., A_n-1, comparators C_0, C_1, ..., C_n-1, and a latch. The comparators C_0, C_1, ..., C_n-1 are utilized for generating the noise to digital signals for generating the random signals $bc_0, bc_1, \ldots, bc_{n-1}$. Besides, the random number generator 500 is also a pseudo random code generator for generating periodic random sequence.

Figure 5:
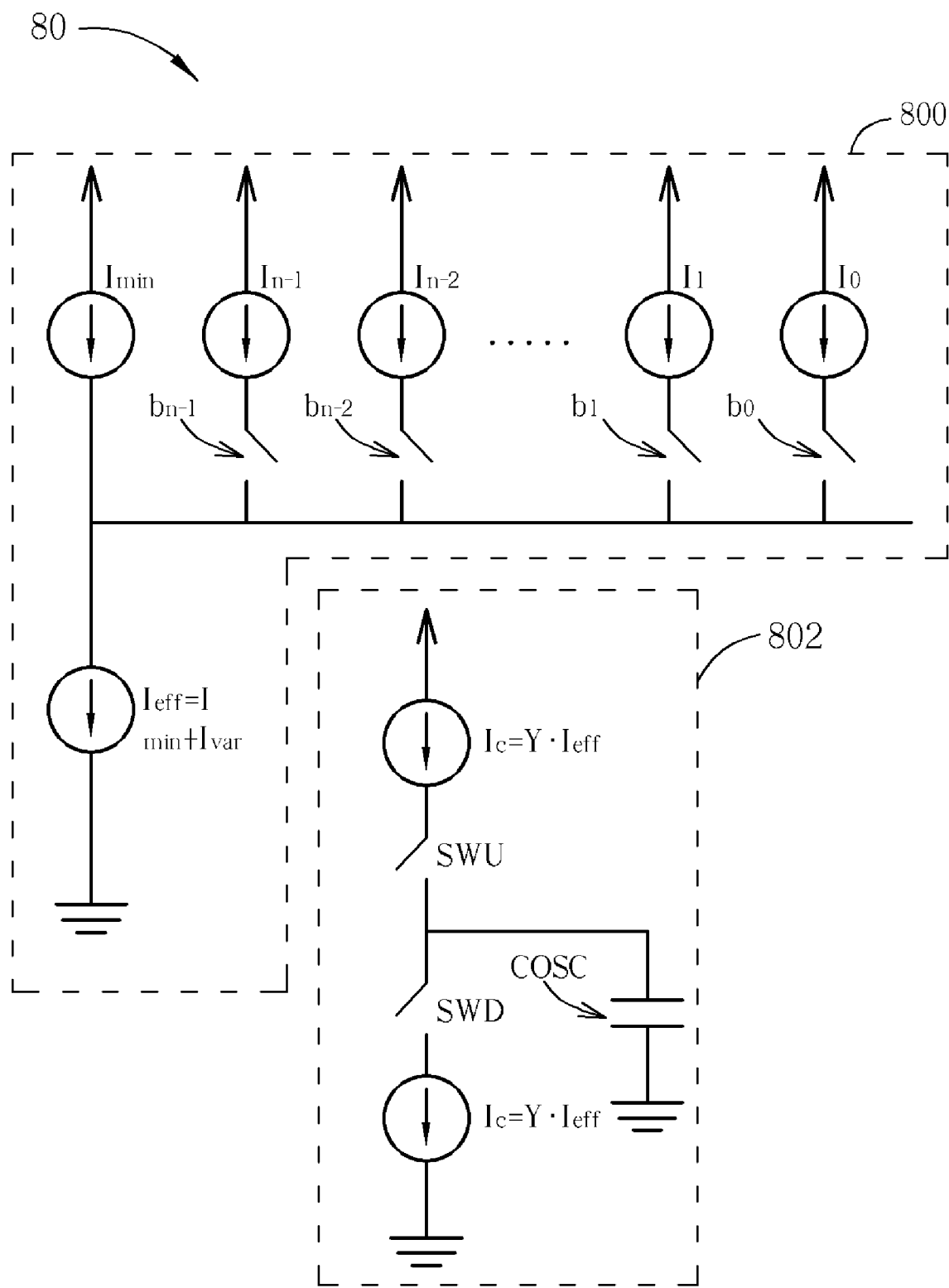
FIG. 5 illustrates a schematic diagram of a triangular wave generator.
Figure 6:
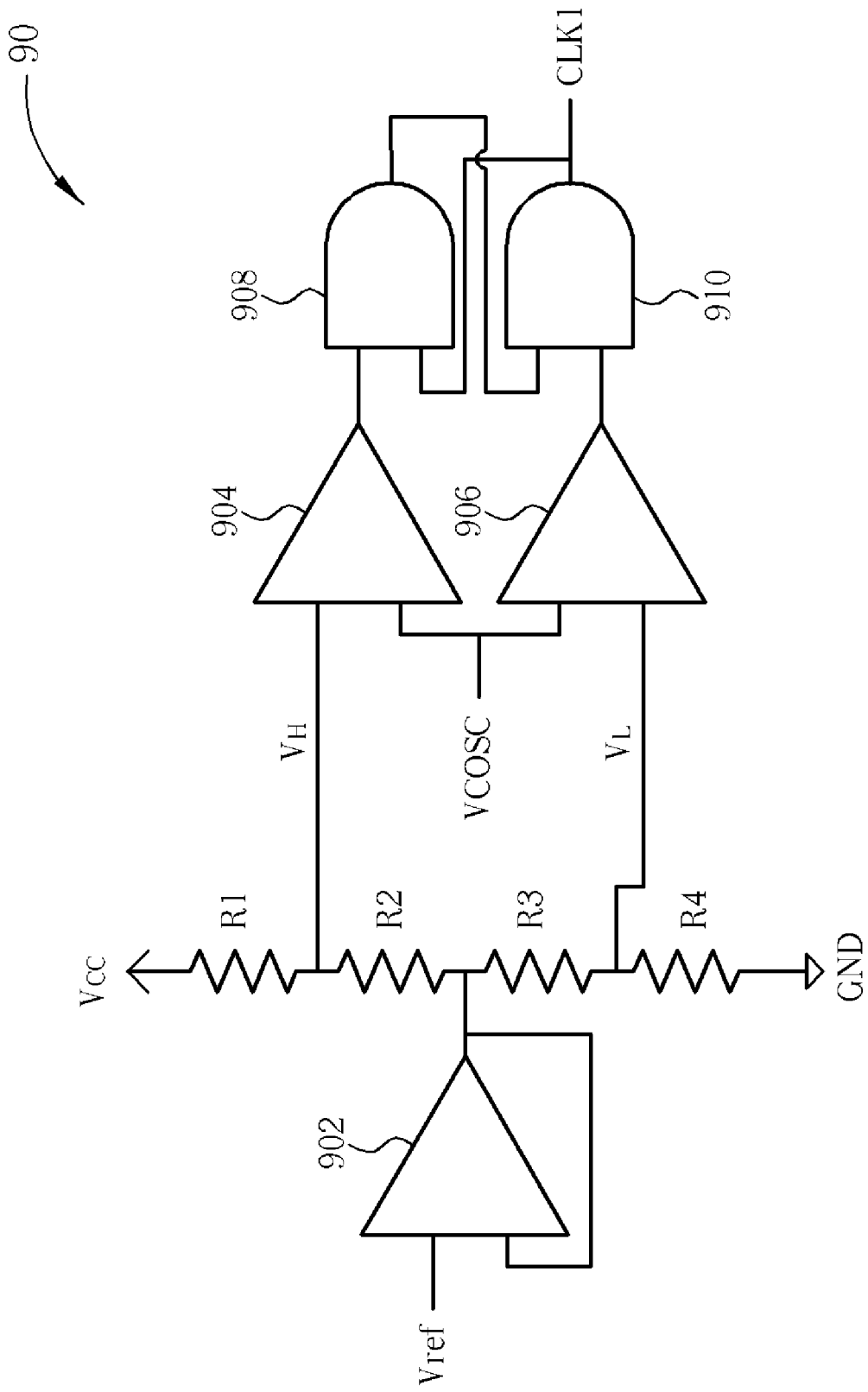
FIG. 6 illustrates a schematic diagram of a wave transformation unit.

The reference wave generator 502 comprises a triangular wave generator 80 and a wave transformation unit 90. The related structures are shown in FIG. 5 and FIG. 6. In the FIG. 5, the triangular wave generator 80 comprises a current transformation circuit 800 and a current integration circuit 802. The current transformation circuit 800 switches the conductance condition of the current sources $I_0, I_1, \ldots, I_{n-1}$ according to the random signals $b_0, b_1, \ldots, b_{n-1}$ for generating a variable current $I_{var}$ to let an equipment current $I_{eff}=I_{min}+I_{var}$. The current integration circuit 802 generates a ratio coefficient Y of the current $I_c$ and $I_{eff}$ according to the equipment current $I_{eff}$ and integrates the current $I_c$ through a capacitance COSC. The cross voltage $V_{COSC}$ of the capacitance COSC corresponds to the triangular wave signal TRI. Numbers of the current sources $I_0, I_1, \ldots, I_{n-1}$ can determine the frequency variations range under the spread spectrum mode. The more the numbers, the wider the frequency variations range. The relationships between the current source $I_0, I_1, \ldots, I_{n-1}$ are:

$$I_1 = 2^1 I_0$$
$$I_2 = 2^2 I_0$$
$$\vdots$$
$$I_{n-1} = 2^{n-1} I_0$$

Variable current $I_{var}$ and the smallest current $I_{min}$ are all directly proportional to the source voltage $V_{cc}$. The coefficients are respectively $X_0$ and $X_{min}$. Therefore, the current $I_c$ is directly proportional the source voltage. The relation is as follows:

$$\begin{aligned}
I_C &= Y \times I_{eff} \\
&= Y(I_{min} + I_{var}) \\
&= Y[X_{min}V_{CC} + (b_{n-1}2^{n-1} + b_{n-2}2^{n-2} + \ldots + b_0 2^0)X_0 V_{CC}] \\
&= V_{CC} Y[X_{min} + (b_{n-1}2^{n-1} + b_{n-2}2^{n-2} + \ldots + b_0 2^0)X_0] \\
&= K \times V_{CC}
\end{aligned}$$

$$K = Y[X_{min} + (b_{n-1}2^{n-1} + b_{n-2}2^{n-2} + \ldots + b_0 2^0)X_0]$$

On the other hand, the wave transformation unit 90 comprises the amplifier 902, the comparators 904, 906, the resistances R1, R2, R3, R4 and the gates 908, 910 generates the threshold voltage $V_H$ and $V_L$ according to the reference voltage $V_{ref}$ which is steadily proportional to a source voltage. Therefore the threshold voltage $V_H$, $V_L$ and $V_H-V_L$ is proportional to the source voltage $V_{cc}$.

$$V_{ref} = X V_{cc}$$

$$V_H = \left(\frac{R_1 X + R_2}{R_1 + R_2}\right) V_{CC}$$

$$V_L = \left(\frac{R_4 X}{R_3 + R_4}\right) V_{CC}$$

$$V_H - V_L = \left[\left(\frac{R_1 X + R_2}{R_1 + R_2}\right) - \left(\frac{R_4 X}{R_3 + R_4}\right)\right] V_{CC} = Z \times V_{CC}$$

Figure 7:
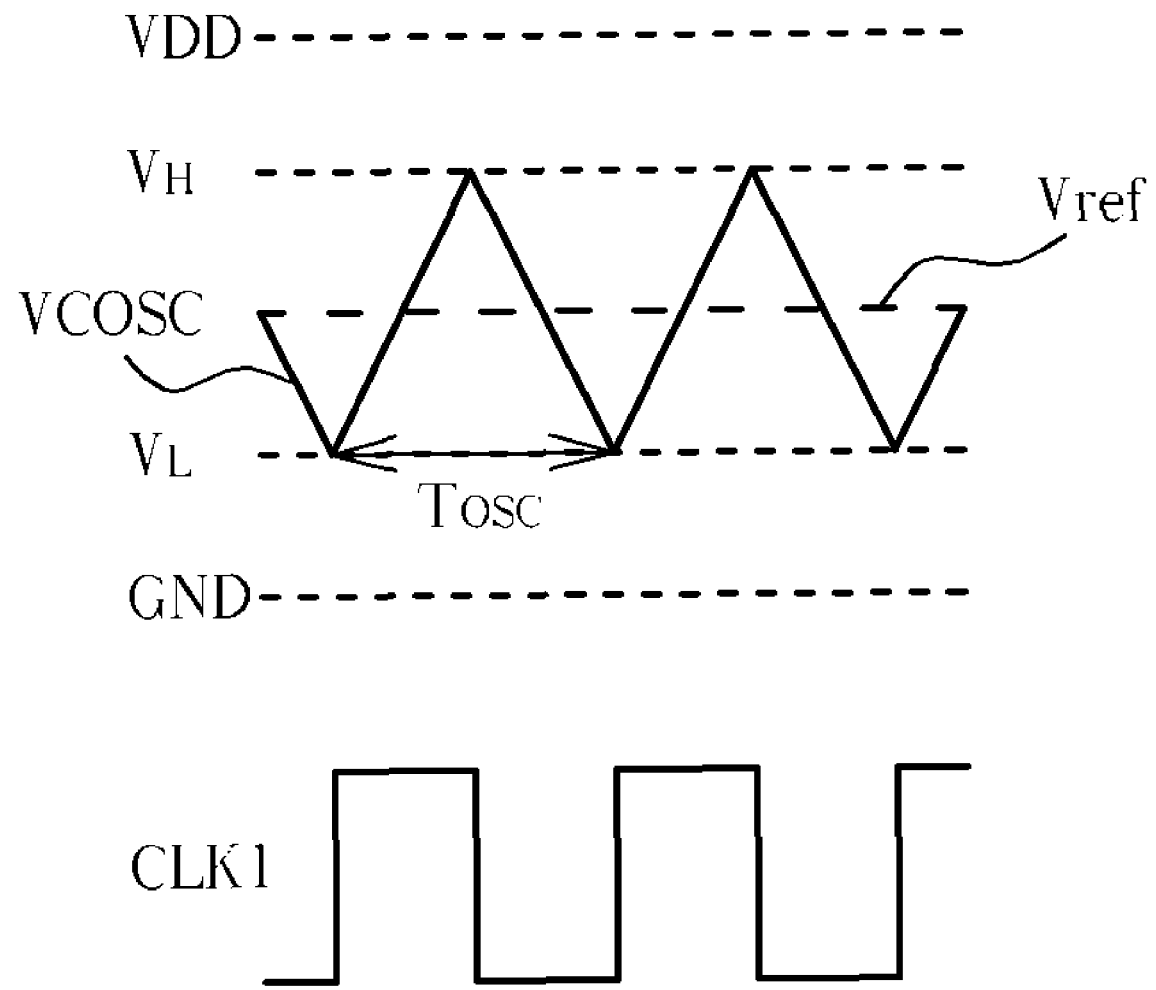
FIG. 7 illustrates an oscillogram corresponding to the wave transformation unit shown in FIG. 6.

The comparison between $V_H$, $V_L$ and the voltage VCOSC is utilized for determining the conductance condition of SWU, SWD and generating the square wave signal CLK1 at the same time. The corresponding signal waveform is shown as FIG. 7. For example, when VCOSC is raised up to $V_H$, the comparator 904 changes state to let the logical gate 908 output the state and transforms CLK1 from the first voltage level to the second voltage level to turn on SWU (open circuit) and turn off SWD (short circuit) for discharging COSC such that VCOSC descends. And when VCOSC has descended to $V_L$, the comparator 906 changes state to let the logical gate 910 output the state and transforms CLK1 from the second voltage level to the first voltage level to turn on SWU (open circuit) and turn off SWD (short circuit) for charging COSC such that VCOSC raises. Therefore a triangular wave TRI and a clock signal CLK1 is periodically generated.

Because the triangular wave amplitude $V_H-V_L$ and the current $I_c$ are all proportional to $V_{cc}$, the generation frequency of the triangular wave is not correlated to the voltage. The relation is as follows:

$$\frac{(V_H - V_L)}{T_{osc}/2} = \frac{I_C}{C}$$

$$V_H - V_L = Z \times V_{CC}$$

$$I_C = KV_{CC}$$

$$\frac{1}{T_{osc}} = f_{osc} = \frac{K \times V_{CC}}{2CZ \times V_{CC}} = \frac{K}{2CZ}$$

Therefore, the ranges of the spread spectrum do not change with voltages. The method can ensure that the operational frequency stays in the predetermined range to avoid effecting the system operation due to the substantial variation by the generation of source voltages. On the other hand, the equaling multiple of the pulse width modulation, loop gain, and the phase can be maintained without changing with the source voltage to avoid the unstable condition of the loop.

Figure 8:
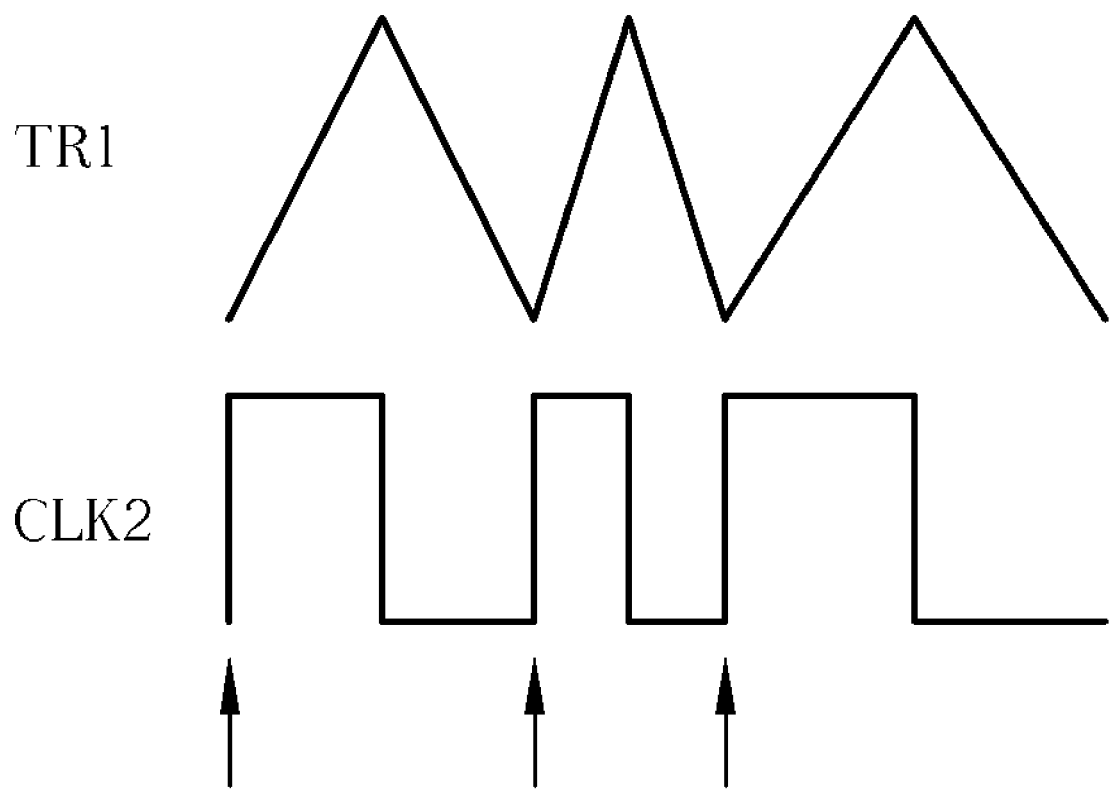
FIG. 8 illustrates a schematic diagram of the slew rate of the triangular wave signal shown in FIG. 1 changing with each period of a square signal.
Figure 9:
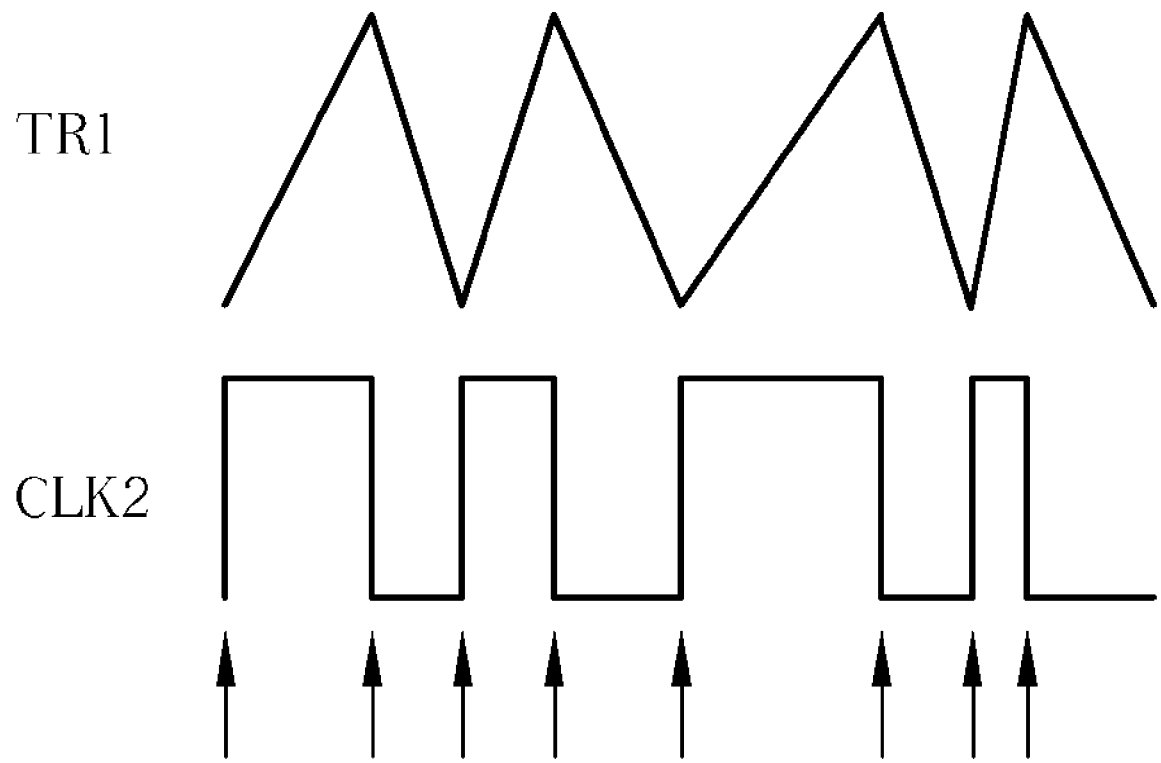
FIG. 9 illustrates a schematic diagram of the slew rate of the triangular wave signal shown in FIG. 1 changing with a square wave edge of a square signal.

From FIG. 1 to FIG. 7, a switching amplifier 300 of a spread spectrum pulse width modulation unit generates a fixed clock and a random clock according to the control signal SSM. For example, when SSM is at the first predetermined level, the random number generator 500 outputs a group of fixed values B. When SSM is at the second predetermined level, the random number generator 500 generates a random signal according to the rising edge, descending edge, or the rising and descending edges of the square wave signal CLK2. The slew rate of the triangular wave signal TRI is determined by random signal $b_0, b_1, \ldots, b_{n-1}$ changing with the generation of the square wave signal CLK2. For example, please refer to FIG. 8 and FIG. 9. FIG. 8 illustrates a schematic diagram of the slew rate of the triangular wave signal changing with the generation of the rising edge of the square signal CLK2. FIG. 9 illustrates a schematic diagram of the slew rate of the triangular wave signal TRI changing with the generation of the descending edge of the square signal CLK2.

The slew rate of the triangular wave signal TRI can change at above transition points and keep a fixed value at transition points. Therefore, linearity of the triangular wave signal TRI can be maintained to let the pulse width modulation unit 412 perform the modulation for video signals according to the above-mentioned.

Figure 10:
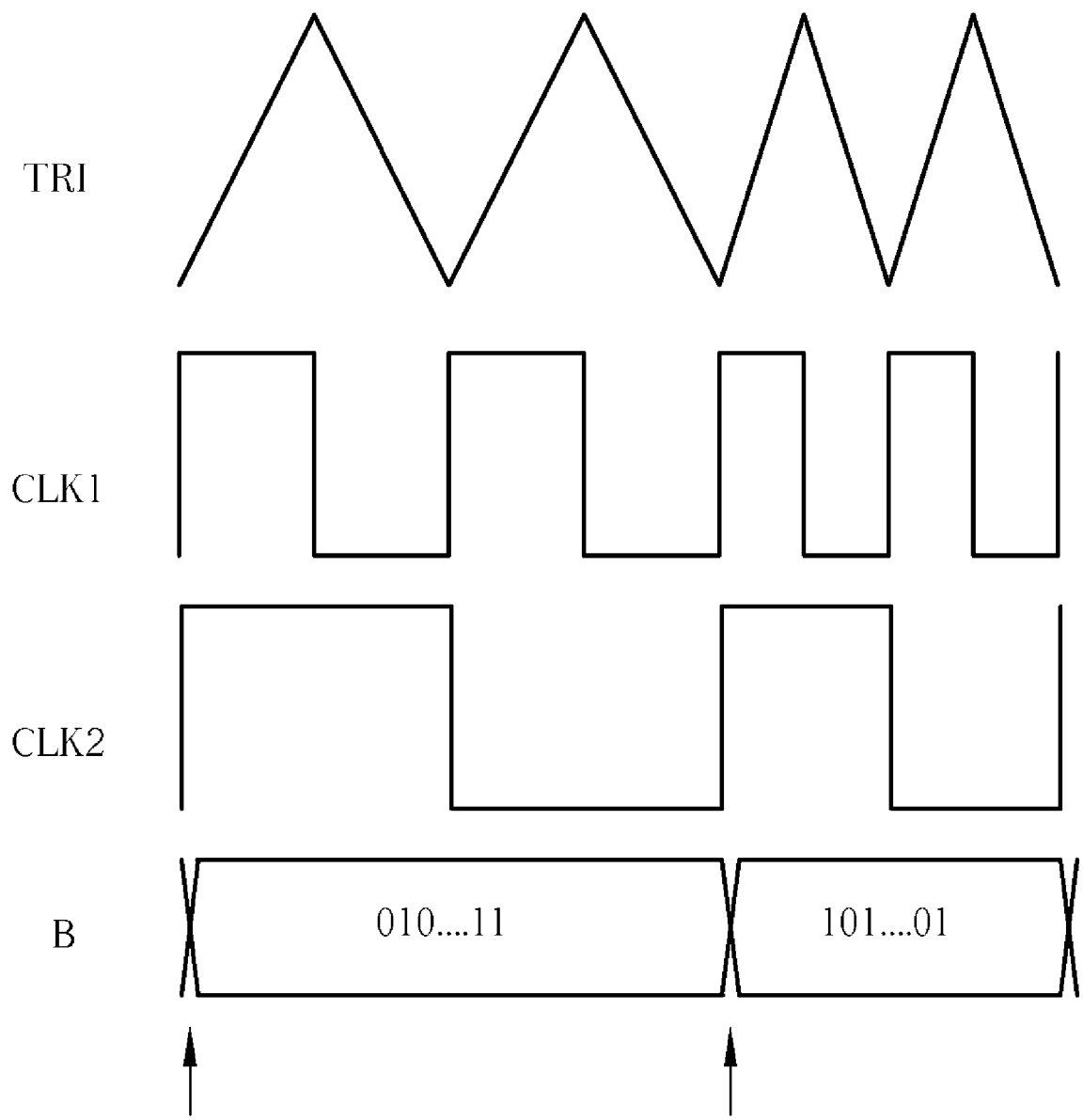
FIG. 10 illustrates a schematic diagram of related signals when the divisor of the trigger signal generator shown in FIG. 2 is 2.
Figure 11:
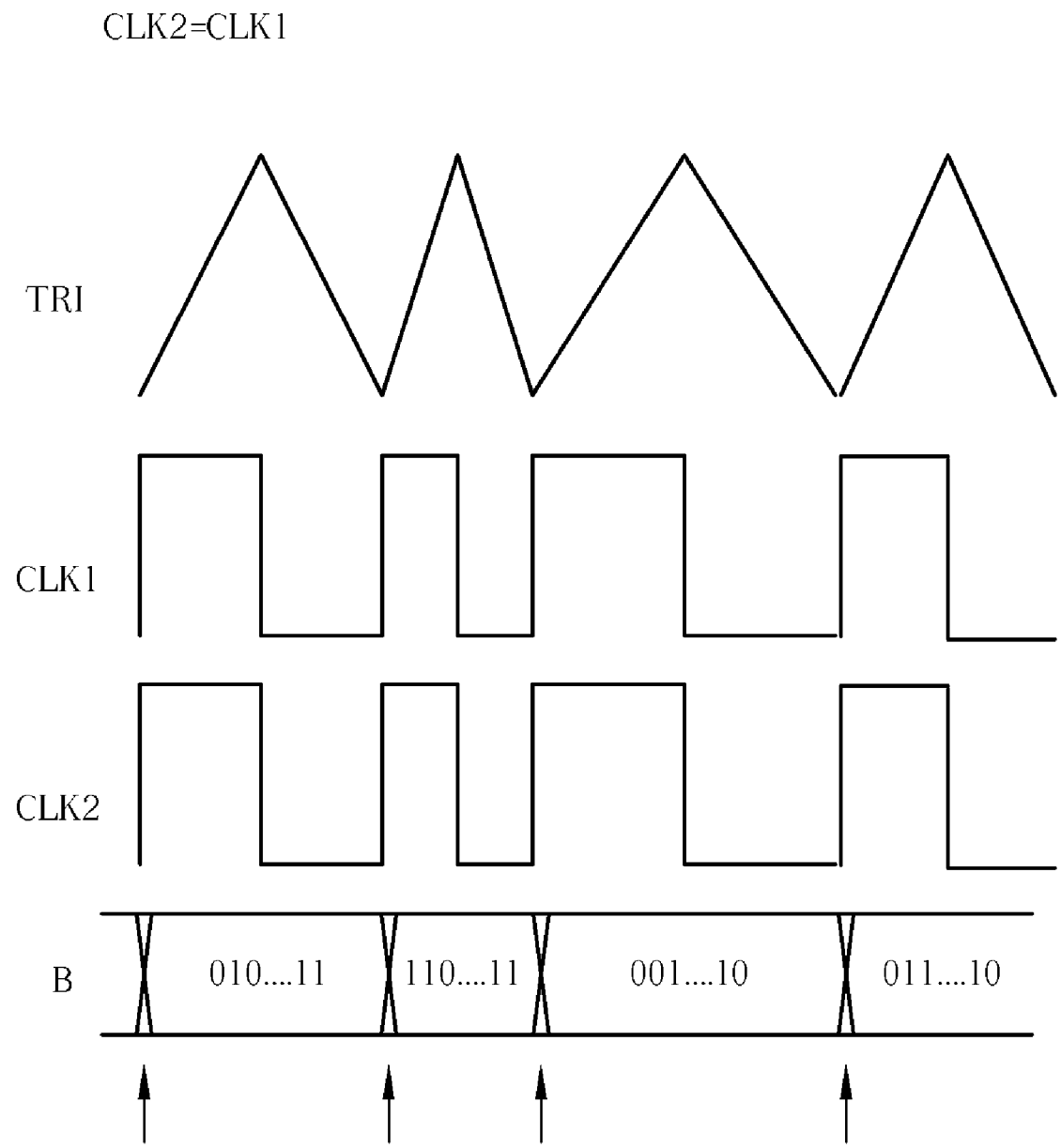
FIG. 11 illustrates a schematic diagram of related signals when the divisor of the trigger signal generator shown in FIG. 2 is 1.

In the present invention, the random number generator 500 generates random signal $b_0, b_1, \ldots, b_{n-1}$ to the reference wave generator 502 at the rising edge of the square signal CLK2 for generating the square signal CLK1 and the triangular wave signal TRI. The pulse width modulation unit 412 performs the pulse width modulation according to the square wave signal CLK1 and the triangular wave signal TRI. The trigger signal generator 504 performs frequency division for the square signal CLK1 for generating the square signal CLK2. The divisor of the trigger signal generator 504 can be set according to different applications. For example, FIG. 10 and FIG. 11 are the relation schematic diagrams among the triangular wave signal TRI, the square wave signal CLK1, CLK2 and random number B when the divisor of the trigger signal generator 504 are respectively 2 and 1.

Note that, the above-mentioned embodiments are for illustrating the present invention, and not limiting the ranges of the present invention. Those skilled in the art can make changes appropriately according to their requirements without departing from the intended scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A random clock generator for a spread spectrum modulating device comprising:
    a random number generator for periodically generating a plurality of random number signals according to a first square wave signal and a control signal;
    a reference wave generator coupled to the random number generator for generating a triangular signal and a second square wave signal according to the plurality of random number signals; and
    a trigger signal generator coupled to the random number generator and the reference wave generator, for generating the first square wave signal according to the second square wave signal.

2. The random clock generator of claim 1, wherein the random number generator outputs a fixed predetermined value without generating the plurality of random number signals when the control signal is at a first predetermined level and generates the plurality of random number signals by trigger of the first square wave signal when the control signal is at a second predetermined level.

3. The random clock generator of claim 1, wherein the trigger signal generator generates the first square wave signal on the rising edge, descending edge, rising and descending edge, rising edge with a multiple period, or descending edge with a multiple period of the second square wave signal.

4. The random clock generator of claim 1, the random number generator is a pseudo random code generator for generating the periodic plurality of random number signals.

5. The random clock generator of claim 4, wherein the pseudo random code generator generates the plurality of random number signals when the control signal is at a second predetermined level and detects one rising edge of the first square wave signal.

6. The random clock generator of claim 4, wherein the pseudo random code generator generates the plurality of random number signals when the control signal is at a second predetermined level and detects one descending edge of the first square wave signal.

7. The random clock generator of claim 1, wherein the random number generator comprises:
    a noise source for generating noise;
    an amplifier coupled to the noise source for amplifying signals generated by the noise source; and
    an analog to digital converter coupled to the amplifier, the reference wave generator, and the trigger signal generator for transforming the noise generated by the noise source into digital signals according to the control signal for generating the plurality of random number signals.

8. The random clock generator of claim 7, wherein the analog to digital converter outputs a fixed predetermined value without generating the plurality of random number signals when the control signal is at a first predetermined level and transforms the noise generated by the noise source into digital signals for generating the plurality of random number signals when the control signal is at a second predetermined level.

9. The random clock generator of claim 1, wherein the random number generator comprises a plurality of random number generation units, each random number generation unit comprising:
    a noise source for generating noise;
    an amplifier coupled to the noise source for amplifying signals generated by the noise source;

a comparator coupled to the amplifier for transforming the noise generated by the noise source into a digital signal; and a latch coupled to the comparator of each random number generation unit of the plurality of random number generation units, the reference wave generator, and the trigger signal generator for accessing the digital signals output from the comparator of each random number generation unit according to the control signal for generating the plurality of random number signals.

10. The random clock generator of claim 9, wherein the latch outputs a fixed predetermined value without generating the plurality of random number signals when the control signal is at a first predetermined level and accesses the digital signals output from the comparator of each random number generation unit when the control signal is at a second predetermined level for generating the plurality of random number signals.

11. The random clock generator of claim 10, wherein the latch accesses the digital signals output from the comparator of each random number generation unit for generating the plurality of random number signals when the control signal is at the second predetermined level and detects one rise edge of the first square wave signal.

12. The random clock generator of claim 10, wherein the latch accesses the digital signals output from the comparator of each random number generation unit for generating the plurality of random number signals when the control signal is at the second predetermined level and detects one descending edge of the first square wave signal.

13. The random clock generator of claim 1, wherein the reference wave generator is further utilized for determining one slew rate of the triangular signal according to the plurality of random number signals, and the frequency of triangular signal is positively correlated with the slew rate.

14. The random clock generator of claim 1, wherein the reference wave generator compares the triangular signal with a group of threshold voltage values for generating the second square wave signal.

15. The random clock generator of claim 1, wherein the reference wave generator comprises:

a triangular wave generator coupled to the random number generator for generating the triangular signals according to the plurality of random signals generated from the random number generator; and a wave transformation unit coupled between the triangular wave generator and the trigger signal generator for comparing the triangular signal with a group of threshold voltage values for generating the second square wave signal.

16. The random clock generator of claim 15, wherein the triangular wave generator comprises:

a current transformation circuit coupled to the random number generator for generating a first current according to the plurality of random number signals generated by the random number generator, and the first current is linearly proportional to a source voltage; and a current integration circuit coupled to the current transformation circuit for generating a second current according to the first current and performing the integration for the second current for generating the triangular signal.

17. The wave transformation unit of claim 15, wherein the group of threshold voltage values is proportional to a source voltage.

18. The random clock generator of claim 16, wherein the current transformation circuit comprises:

a plurality of current sources;
a output end for generating the first current; and
a plurality of current switches, each current switch comprising:
    a first end coupled to a current source of the plurality of current sources;
    a second end coupled to the output end; and
    a third end coupled to a digital signal of the plurality of digital signals for controlling signal connection from the first end to the third end according to the digital signal level.

19. The random clock generator of claim 16, wherein the current integration circuit comprises:

a first current mirror for mapping the first current generated by the current transformation circuit according to a second predetermined multiple;
a second current mirror for mapping the first current generated by the current transformation circuit according to a first predetermined multiple;
a current output end;
a first switch coupled between the first current mirror and the current output end for controlling signal connection of the first current mirror and the current output end;
a second switch coupled between the second current mirror and the current output end for controlling signal connection of the second current mirror and the current output end; and
a integration element coupled to the current output end for performing integration for current of the current output end for generating the triangular signal.

20. The random clock generator of claim 19, wherein the integration element is a capacitance.

* * * * *